United States Patent
Sambandan et al.

(10) Patent No.: US 8,766,367 B2
(45) Date of Patent: Jul. 1, 2014

(54) TEXTURED GATE FOR HIGH CURRENT THIN FILM TRANSISTORS

(75) Inventors: Sanjiv Sambandan, Bangalore (IN); Robert A. Street, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 180 days.

(21) Appl. No.: 13/173,344

(22) Filed: Jun. 30, 2011

(65) Prior Publication Data
US 2013/0001689 A1   Jan. 3, 2013

(51) Int. Cl.
*H01L 27/088* (2006.01)

(52) U.S. Cl.
USPC .......... 257/368; 257/E29.111; 257/E29.112; 257/E29.113; 257/E29.13; 257/E29.134; 257/E29.135; 257/E29.136; 257/E29.137; 257/213; 257/E27.06; 257/256; 257/262; 257/E21.409; 438/142; 438/141; 438/151; 438/157; 438/159; 438/195; 438/260; 438/587; 438/585

(58) Field of Classification Search
None
See application file for complete search history.

(56) References Cited

U.S. PATENT DOCUMENTS

| | | | |
|---|---|---|---|
| 5,229,310 A * | 7/1993 | Sivan | 438/156 |
| 5,691,782 A * | 11/1997 | Nishikawa et al. | 349/47 |
| 6,242,304 B1 | 6/2001 | Geusic et al. | |
| 6,331,465 B1 | 12/2001 | Forbes et al. | |
| 6,476,441 B2 | 11/2002 | Geusic et al. | |
| 6,706,597 B2 | 3/2004 | Geusic et al. | |
| 2002/0094594 A1* | 7/2002 | Kim et al. | 438/30 |
| 2005/0127367 A1* | 6/2005 | Huh et al. | 257/72 |
| 2007/0032091 A1* | 2/2007 | Heald et al. | 438/758 |
| 2007/0105396 A1* | 5/2007 | Li et al. | 438/758 |
| 2007/0182675 A1* | 8/2007 | Yamazaki et al. | 345/76 |
| 2008/0026532 A1* | 1/2008 | Duan et al. | 438/287 |
| 2009/0161438 A1* | 6/2009 | Sandhu et al. | 365/185.18 |

OTHER PUBLICATIONS

Khang et al "Mechanical Buckling: Mechanics, Metrology, and Stretchable Electronics" www.afm-journal.de (2008): pp. 1-11.*
Wegener,H.A.R., "Endurance Model for Textured-Poly Floating Gate Memories", Electron Devices Meeting, 1984 International, pp. 480-483.

\* cited by examiner

*Primary Examiner* — Fei Fei Yeung Lopez
(74) *Attorney, Agent, or Firm* — Fay Sharpe LLP (57) ABSTRACT

A textured thin film transistor is comprised of an insulator sandwiched between a textured gate electrode and a semi-conductor. A source electrode and drain electrode are fabricated on a surface of the semi-conductor. The textured gate electrode is fabricated such that a surface is modified in its texture and/or geometry, such modifications affecting the transistor current.

17 Claims, 10 Drawing Sheets

TEXTURED GATE FOR HIGH CURRENT THIN FILM TRANSISTORS

BACKGROUND

The present application is directed to the configuration of semiconductor based devices and more particularly to configuring semiconductor based devices such as Thin Film Transistors (TFTs) with an increased current flow.

Figure 1:
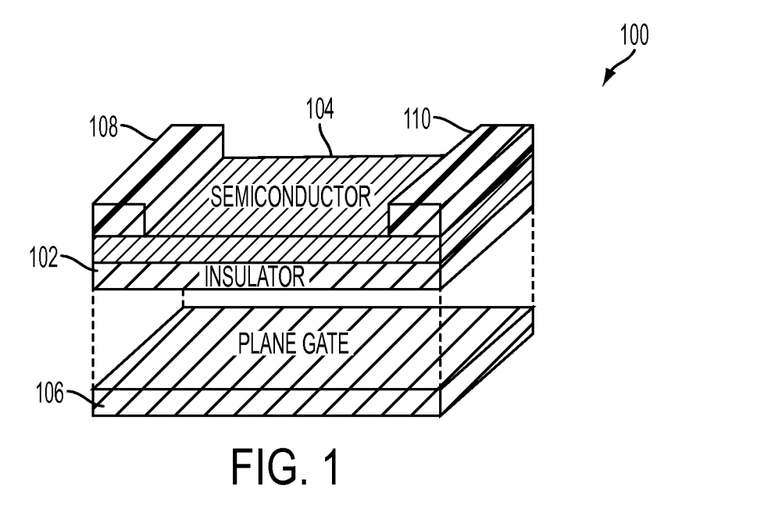
FIG. 1 illustrates the structure of an existing type of TFT.

A typical existing TFT structure 100 is shown in FIG. 1, and consists of a stack including an insulator 102 and semiconductor 104 deposited over a plane (or planar) gate electrode 106. The source electrode 108 and drain electrode 110 are deposited over semiconductor 104 with doping at the contacts, and some overlap between the source and drain electrodes and gate electrode 106 to ensure low contact resistance.

Thin film transistors (TFTs) based on non-crystalline semiconductors are of interest for a number of uses including but not being limited to large area electronics. In some of these implementations TFTs are employed as access switches, such as for electronic based pixel configurations. For these and other uses it is preferable to have a fast turn on of the TFTs to improve access speed. It is understood that the turn on speed of TFTs may be increased by increasing currents in the TFTs.

In order to attain higher currents in existing TFTs structures, there are two passive approaches. The first is to increase the aspect ratio of the TFTs. In one instance, the aspect ratio may be increased by increasing channel width, which is at the cost of parasitic capacitance. The second approach to increase the aspect ratio would be to reduce channel length. The second passive approach to attain higher currents is to increase the dielectric capacitance. If the dielectric coefficient remains unchanged this is accomplished by making the dielectric thin. Such an approach comes with the cost of creating pinholes in the device structure.

It is therefore considered beneficial to provide a TFT configuration that improves the current flow as a way to achieve fast TFT turn on, and which overcomes at least some of the issues in existing approaches.

BRIEF DESCRIPTION

A textured thin film transistor is comprised of an insulator sandwiched between a textured gate electrode and a semiconductor. A source electrode and drain electrode are fabricated on a surface of the semiconductor. The textured gate electrode is fabricated such that a surface is modified in its texture and/or geometry, to thereby affect the transistor current.

BRIEF DESCRIPTION OF THE DRAWINGS

FIG. 10 illustrates transfer characteristics of the planar and corrugated gate TFT of FIG. 9 at turn on;

DETAILED DESCRIPTION

Figure 2:
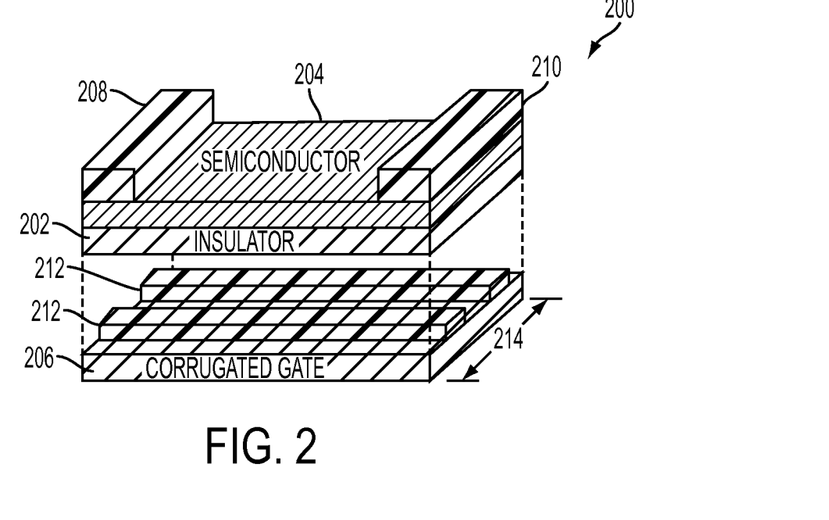
FIG. 2 illustrates a TFT structure according to the present concepts.

Turning now to FIG. 2 a TFT structure 200 is configured according to the methods and concepts of the present application. Similar to TFT structure 100 of FIG. 1, TFT structure 200 includes an insulator 202 and semiconductor 204. However, as its gate electrode, TFT structure 200 employs a textured gate electrode 206 as opposed to the planar type gate structure of FIG. 1. Then similar to structure 100 a source electrode 208 and drain electrode 210 are deposited over (or on) semiconductor 204, with doping at the contacts and some overlap between the source and drain electrodes and textured gate electrode 206 to provide low contact resistance. The texture of gate electrode 206, in the embodiment of FIG. 2, is a corrugation design having a series of ridges (or stripes) 212 positioned to lie along channel length 214 which extends from source electrode 208 to drain electrode 210. This arrangement may also be described as a linear texturing of the gate using flat and high curvature stripes.

It is to be understood the method of forming the textured TFT of FIG. 2 may be accomplished by a number of processing steps having a varying order from the above description. For example, in one embodiment, a method would first process the textured gate electrode, and then the insulator would be layered or deposited over the textured gate electrode. Thereafter, the semiconductor would be layered or deposited over the insulator layer, thereby sandwiching the insulator layer between the textured gate and semiconductor layer. At this point, the source electrode and drain electrode are fabricated on the semiconductor.

Figure 3:
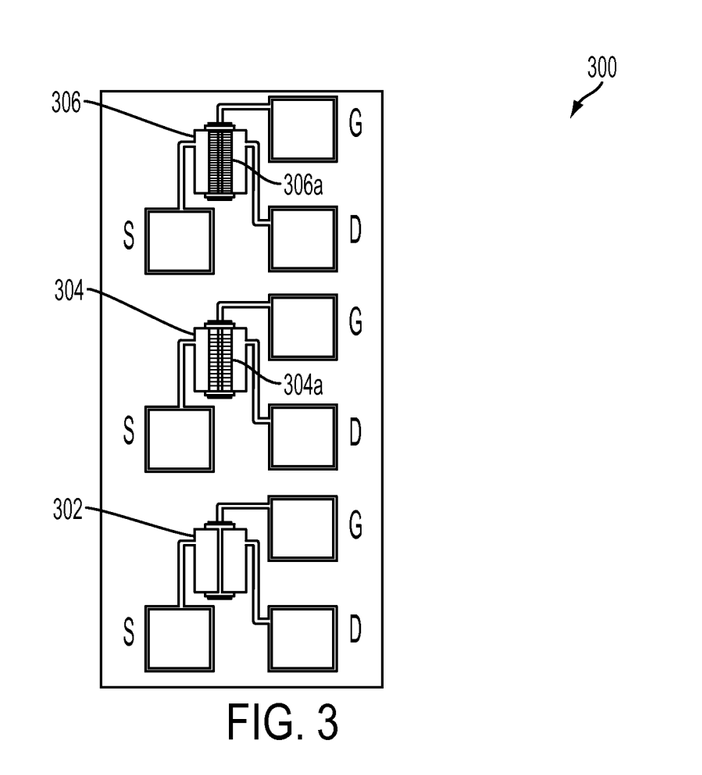
FIG. 3 illustrate three TFT with one plane gate, and two with corrugated gates.

FIG. 3 provides an image 300 showing three TFTs (i.e., TFT 302, TFT 304 and TFT 306). The bottom image is of TFT 302 fabricated using a plane gate. TFT 304 and TFT 306 have both been fabricated according to concepts of the present application, where TFT 304 includes a textured gate with low density ridges (or stripes) 304a and TFT 306 includes a textured gate with high density ridges (or stripes) 306a. Low density is understood here to mean that the spacing between ridges (or stripes) is greater than the spacing between the ridges (or stripes) of the high density TFT. By this arrangement TFT 306 will have more ridges (or stripes) than TFT 304 within the same physical space or area. As will be explained in more detail below, the density (or spacing) of the ridges (or stripes) result in or cause differences in the operation of the TFTs.

It is to be appreciated and is shown in FIG. 3 that the texturing of the gate electrode results in at least a portion of the semiconductor and the insulator also having a corresponding texture. This is why the corrugations of TFTs 304 and 306 can be seen in FIG. 3 even though the semiconductor and insulator are layered over the gate electrodes. The texture will be slightly smoothed out by the natural process of film deposition on top of the textured gate. It is also worth noting that these images show the corresponding connection pads and connection lines for the gates (G), source (S) and drain (D), for each FET.

Figure 4:
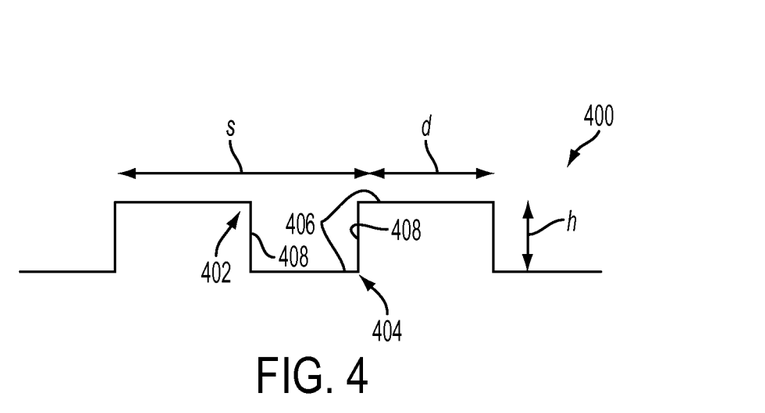
FIG. 4 is a description of the geometry of the corrugations taken from the perspective of a side view of the TFTs.

FIG. 4 emphasizes certain structural aspects of a TFT fabricated according to the present concepts taken from a side view perspective 400 of such a TFT. Particularly, the presence of texture on the textured (corrugated) gate electrode 206 presents a series of convex edges 402 and concave edges 404 along with plane regions 406, and vertical (or sloped) faces 408. FIG. 4 also defines the geometry of the texture (e.g., corrugations) having height (h), width (d), and pitch (s).

By this arrangement, when textured gate 206 is set to some potential, the conductive surface of textured gate 206 requires the charge to distribute un-equally such that convex edges 402 have a higher charge density compared to plane regions 406, and concave edges 404 have a lower charge density compared to plane regions 406. Thus, the electric field normal to and just above convex edges 402 are higher compared to plane regions 406, and the electric field normal to and just adjacent to concave edges 404 are lower compared to plane regions 406. Equivalently, the potential just above convex edges 402 decrease more rapidly compared to plane regions 406, and the potential just adjacent to concave edges 404 decrease less rapidly compared to plane regions 406.

Figure 5:
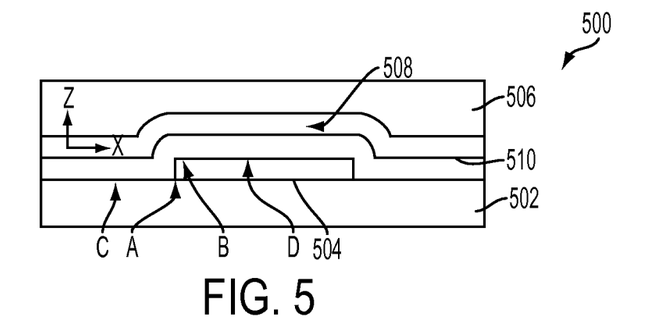
FIG. 5 illustrates a capacitor structure used for simulation.

Attention is now directed to FIGS. 5-8 which are used to further describe the above concepts. FIG. 5 illustrates a capacitor 500, with a lower metal electrode 502 having a corrugation 504 running through the depth, and set at 20V with respect to a top metal electrode 506. An insulator 508 is shown sandwiched between the two electrodes (502 and 506). The lower metal electrode 502 with corrugation 504 includes identified concave edge (A), convex edge (B), and plane regions (C, D).

Figure 6:
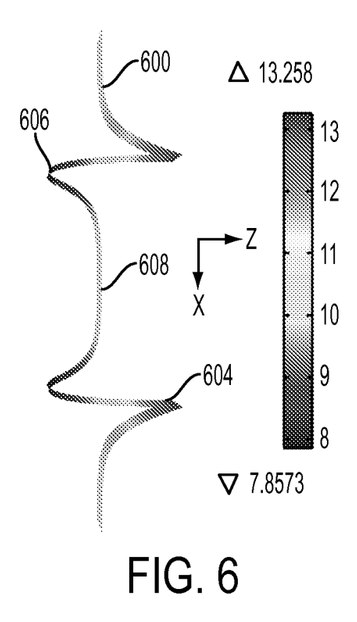
FIG. 6 illustrates a potential of the conformal surface lying in the middle of the insulator of FIG. 5.
Figure 7:
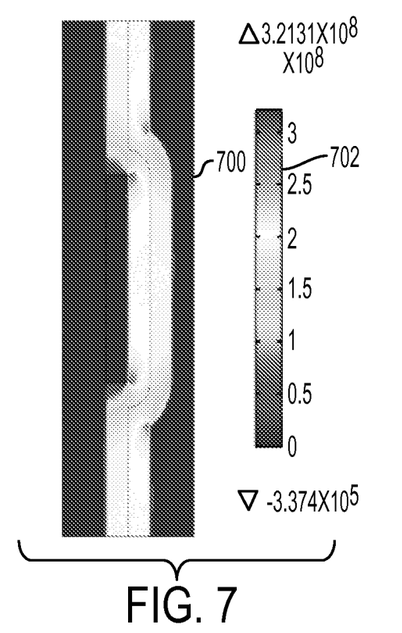
FIG. 7 illustrates the z-component of the electric filed in a cross-sectional slice of the structure.
Figure 8:
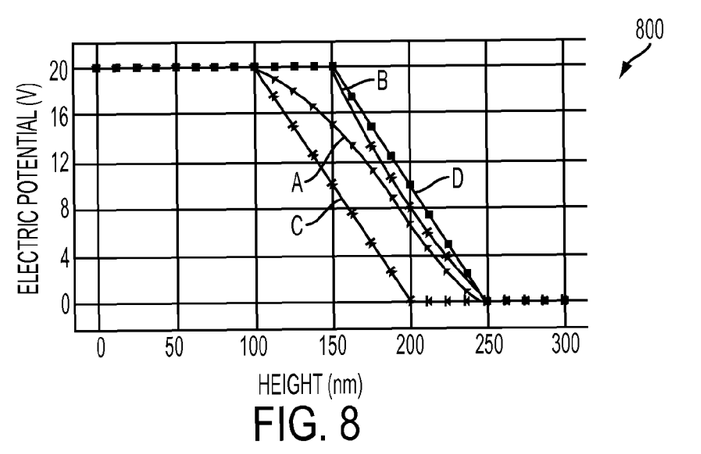
FIG. 8 illustrates the variation of potential in the insulator along the z-axis over regions of the structure.

FIG. 6 illustrates a simulation of the potential profile 600 along a conformal surface (labeled 510 in FIG. 5) that lies in the middle of insulator 508 of FIG. 5. If the insulator layer above this surface is replaced with a semiconductor (with same dielectric coefficient), FIG. 6 is then describing the surface potential of the semiconductor prior to channel formation. The height of the plotted profiles 600 is proportional to the potential, and the colors (shading/hatching) corresponds to color bar 602, which defines a range of approximately 8 v to 13 v along plot 600 for the convex 604, concave 606, and plane 608 portions. This figure supports the electric field discussion set out in connection with FIG. 4. FIG. 7 shows the z-component values of an electric field in a cross-sectional slice 700 of the structure of FIG. 5, where the z-component values in the cross-sectional slice 700 corresponds to color bar 702, which defines a range of approximately $3 \times 10^5$ to $3 \times 10^8$ V/cm along cross-section 700. FIG. 8 shows the potential variation (versus height) in the insulator along the z-axis over the regions labeled A, B, C and D in FIG. 5. Nonlinear potential variations over the concave edges (A) and convex edges (B) are noticeable.

Having described the concepts of corrugated TFTs attention is now turned to comparing the operation of such TFTs to TFTs using a plane gate electrode. Therefore, both plane gate TFTs and corrugated gate TFTs were fabricated using hydrogenated amorphous silicon (a-Si:H) technology. The dielectric was 150 nm thick, with the a-Si:H semiconductor being 50 nm. First a planar gate metal layer of 100 nm of Mo—Cr was patterned. For the corrugated gate TFTs, an additional 100 nm of Ti—W was patterned as corrugations over the base Mo—Cr gate metal. A stack of 200 nm Si—N, 150 nm a-Si:H were then deposited with 70 nm n+ doped a-Si:H at the source-drain contacts. The gate dielectric vias were then patterned and etched after which 200 nm of Mo—Cr was deposited and patterned for source-drain contacts. The electrodes and n+ a-Si:H were etched in unwanted regions, and a-Si:H semiconductor islands were patterned. Both corrugated and planar gate TFTs were fabricated on the same wafer.

Figure 9:
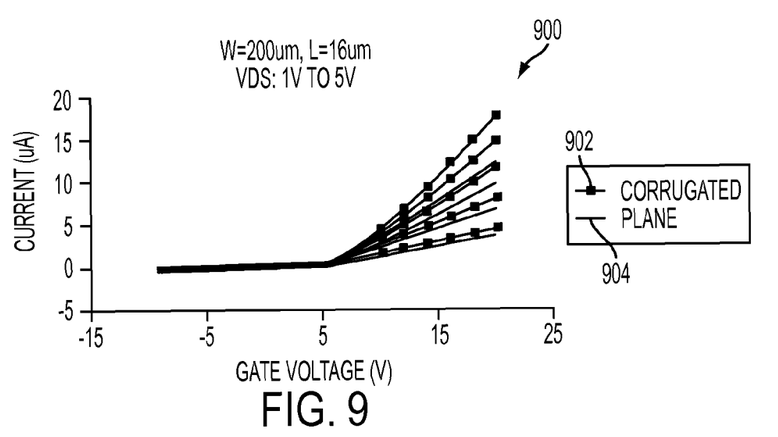
FIG. 9 illustrates transfer characteristics of a planar and corrugated gate TFT.

Measurements of the fabricated TFTs were then made. For example, FIG. 9 shows a graph 900 which compares the transfer characteristics of a corrugated gate TFT (line with markers) 902 and a plane gate TFT (solid line) 904 as the drain-source voltage varies from 1V to 5V in 1V steps. The geometry of the corrugations of the corrugated TFT is defined by h=30 nm, d=3 μm, s=8 μm (where h=height, d=width and s=pitch). As shown in graph 900 the effective mobility is larger for the corrugated gate TFT compared to the plane gate TFT.

Figure 10:
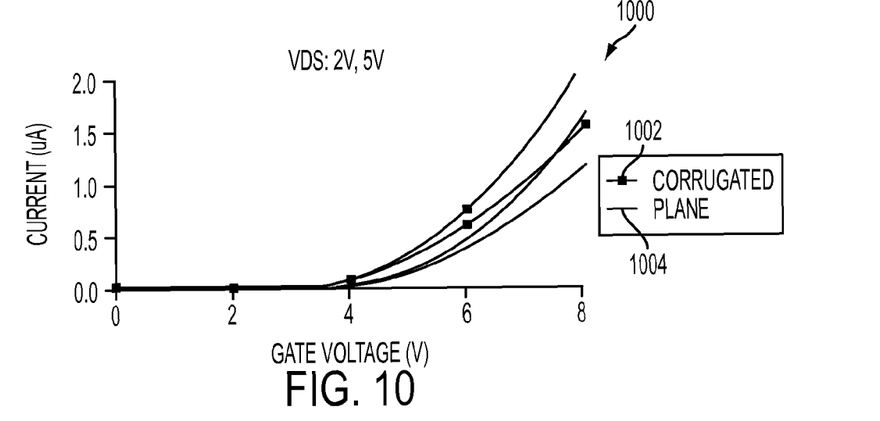
Figure 11:
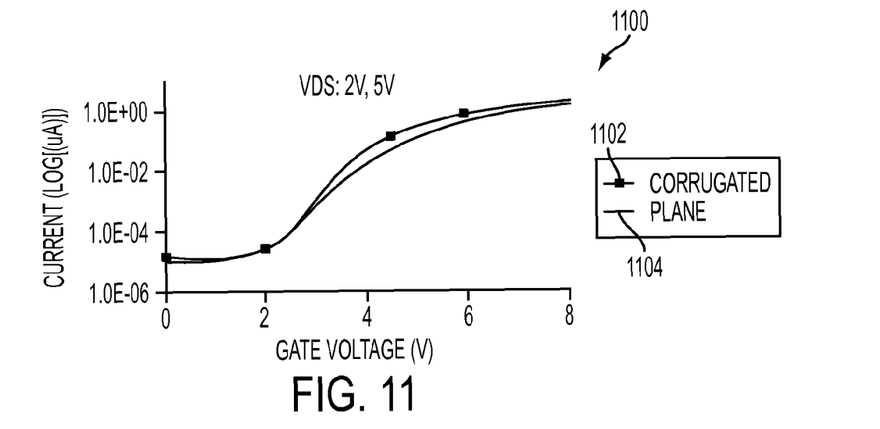
FIG. 11 illustrates a semi-log plot of FIG. 10

FIGS. 10 and 11 show graphs 1000 and 1100, which illustrate a comparison between the operation of the corrugated gate TFT (identified by lines 1002 and 1102) and operation of the plane gate TFTs (identified by 1004 and 1104) during turn on for drain-source voltages of 2V and 5V. Where graph 1100 is a semi-log plot of graph 1000. It is seen from graphs 1000, 1100 that the corrugated gate TFTs turn on faster and have a higher sub-threshold slope compared to the plane gate TFT.

Figure 12:
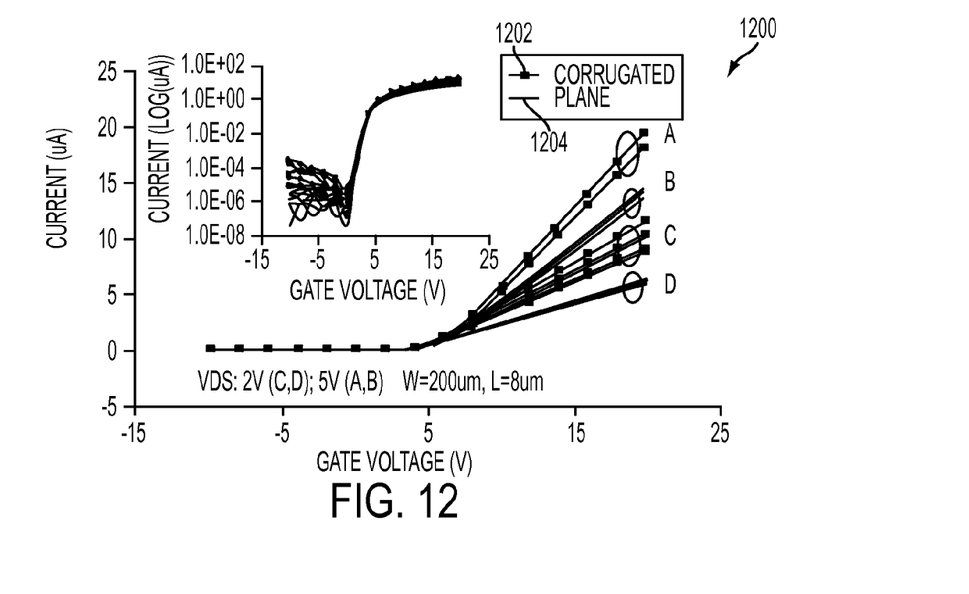
FIG. 12 illustrates transfer characteristics of four plane and corrugated gate TFTs.

FIG. 12 shows a graph 1200 illustrating the transfer characteristics on linear and semi-log scales at drain-source voltages of 2V (labeled C,D) and 5V (labeled A,B) for four different corrugated (A,C) and plane gate (B,D) TFTs, where the corrugated gate TFTs characteristics are shown by (line with markers) 1202 and the plane TFTs characteristics are shown by (solid line) 1204. The leakage current of the corrugated gate TFTs is about two orders higher than the plane gate TFT.

Figure 13:
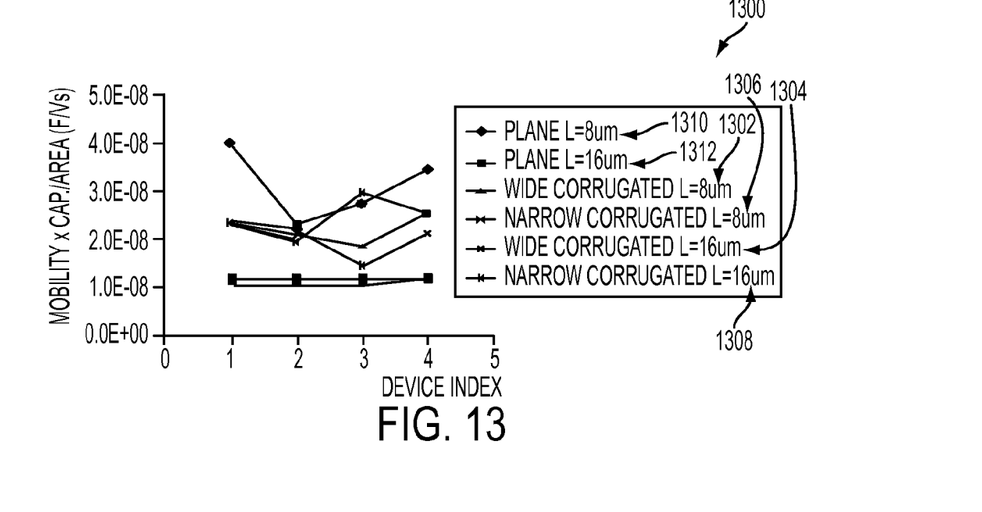
FIG. 13 illustrates mobility-capacitance/unit area product for several plane and corrugated gate TFTs.

FIG. 13 is a graph 1300 which compares the mobility-capacitance product of several wide corrugated (d=6 μrm, s=9 μm), narrow corrugated (d=3 μm, s=8 μm) and plane gate TFTs. The wide corrugated TFTs are identified by designators 1302 and 1304, the narrow corrugated TFTs are identified by designators 1306 and 1308, and the plane TFTs are identified by designators 1310 and 1312. As evidenced by FIG. 13, the corrugated gate TFTs consistently show higher values of mobility-capacitance product compared to the plane gate TFTs. The faster turn on, and higher mobility improves the on currents of the corrugated gate TFTs compared to the plane gate TFTs.

The reason for faster turn on of the corrugated gate TFTs is believed to be due at least in part to the influence of the concave edge on the surface potential prior to channel formation. Prior to channel formation, the surface potential varies with the applied gate voltage as most of the induced charges fill the deep and band tail states with a negligible amount of charge present as free carriers. In the case of the corrugated gate TFT, the surface potential over the concave edge is higher for a given gate voltage as compared to the plane gate (as shown in for example in FIG. 6). Therefore, this surface of the semiconductor reaches the channel formation potential at a lower gate voltage, thereby turning on the transistor faster. The x-component of the electric field over the convex edge aids in bringing more carriers over the concave edge. The corrugations are configured in some embodiments to increase the resistance of the carriers going through the gate to the channel.

Figure 14:
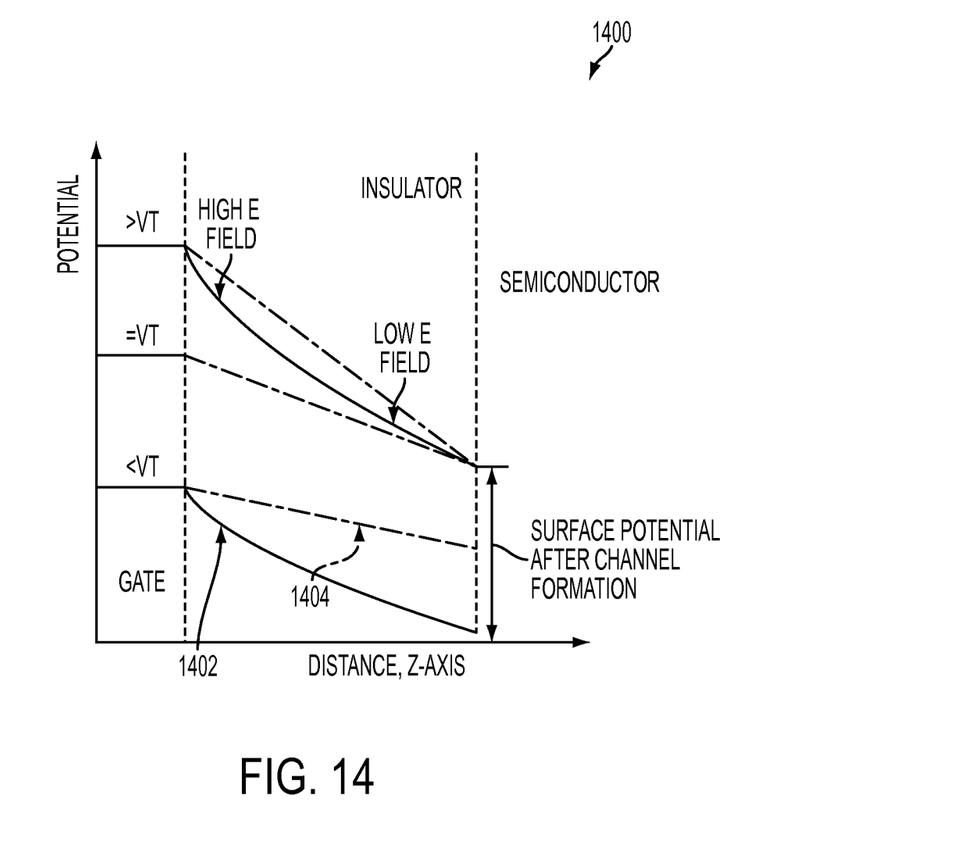
FIG. 14 illustrates a potential profile over the convex edge (solid) and plane region (dashed) of the gate as the gate voltage is varied.
Figure 15:
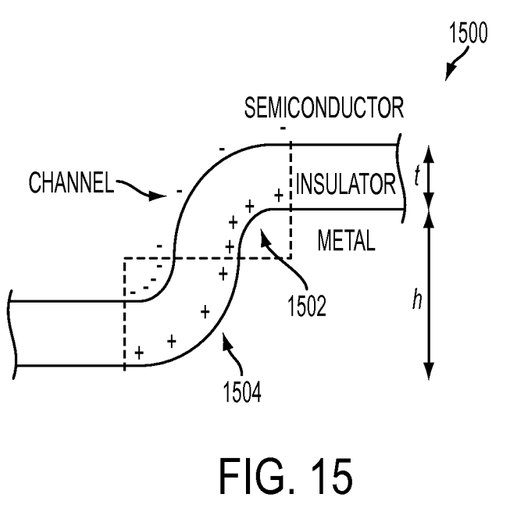
FIG. 15 illustrates a channel charge profile over the edges assuming the channel-insulator-gate form cylindrical capacitors.

The reason for the higher mobility-capacitance product in the corrugated gate TFT is believed to be due at least in part to the influence of the convex edge after channel formation. After channel formation the surface potential is almost fixed as any further increase in the gate voltage only brings more free carriers to the semiconductor-insulator interface. Consider, as shown in FIG. 14, the potential drop in the insulator over the convex edge (solid lines) 1402 and plane region (dashed lines) 1404. Since the potential drops faster nearer the gate-insulator interface due to the high field, it drops slower to the fixed surface potential near the semiconductor-insulator interface. Therefore, after channel formation, the electric field over the convex edge and nearer the semiconductor-insulator interface (and hence the channel) is lower compared to the plane region of the gate. Secondly, as shown in FIG. 15, the channel-insulator-gate forms approximately cylindrical capacitors over the convex edges 1502 and concave edges 1504. However, the convex edge forms the inner electrode of the cylindrical capacitor with higher charge density while the same charge is spread over a larger surface in the channel. Both these factors (i.e., the lower electric field in the channel at the insulator interface, and lower surface charge density in the channel) over the convex edge, ensure that the channel extends deeper into the semiconductor as compared to the plane gate thereby improving the field effect mobility. The concave edge is expected to have the opposite effect. Therefore, both the convex and concave portions contribute to increased current flow between the source and the drain.

The texture (e.g., corrugations) influence the performance in other ways as well. First, the presence of corrugations results in the semiconductor having a corrugated feature itself thereby increasing the effective channel width of the TFT to W(1+2h=s), where W is the channel width of the plane gate TFT. Second, the effective capacitance per unit area in the plane gate TFT differs from the corrugated gate TFT. Using the cylindrical capacitor approximation of the previous discussion, the effective capacitance per unit area can be shown to be approximately $$\frac{\epsilon}{t}\left(1 - 2h/s + \frac{4\pi t/s}{\ln(|h + 2t|/|h|)}\right),$$

where $\in$ the permittivity, t is the dielectric thickness. Since s is >>(h; t), both the variations in channel width and capacitance are negligible.

Figure 16:
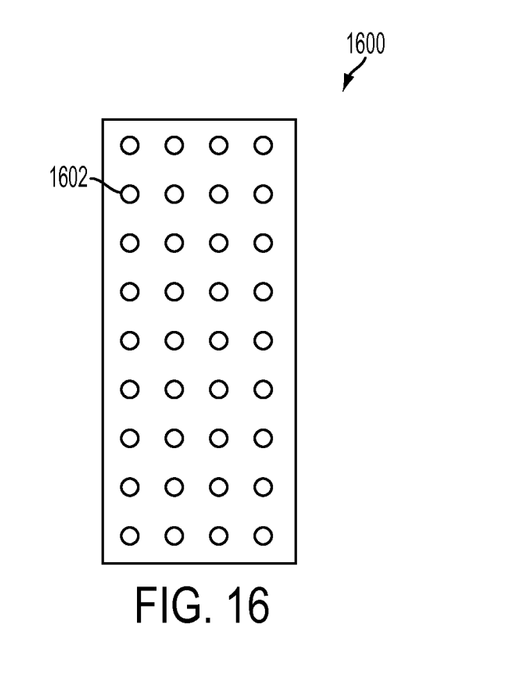
FIG. 16 illustrates an alternative corrugated surface.
Figure 17:
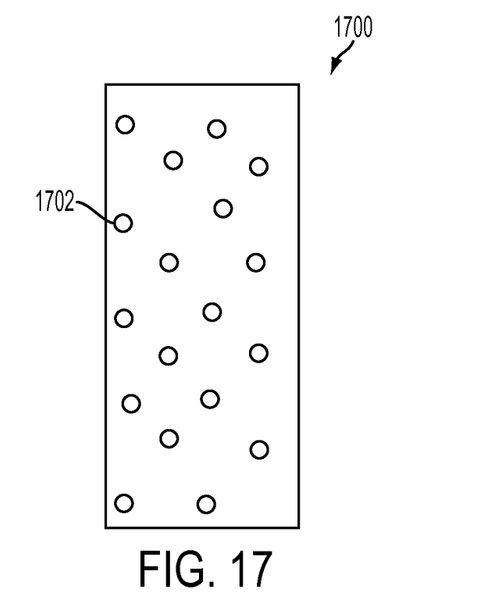
FIG. 17 illustrates another alternative corrugated surface.

It is to be appreciated that while the foregoing has primarily identified the textured surface of the gate as being corrugated by the use of ridges (or stripes), other geometric shapes and arrangements are equally applicable to the present concepts. For example, FIG. 16 illustrates a textured gate electrode 1600, which in place of ridges (or stripes), the method of fabrication textures the surface with individual elements 1602 such as in the form of cylinders, rectangular columns, cones, spheres, or other geometric shapes. Further, the arrangements do not have to be in the form of rows mimicking the ridges (or stripes). Rather, as shown by the textured gate electrode 1700 of FIG. 17 the arrangement or positioning of elements 1702 making up the textured surface may be in a "polka dot" pattern, as well as other patterns, or be arranged randomly. The elements may be arranged varying density over the gate surface. Variation in the density can create variation in current levels (since there is a variation in the degree of percolation from source to drain.

Figure 18:
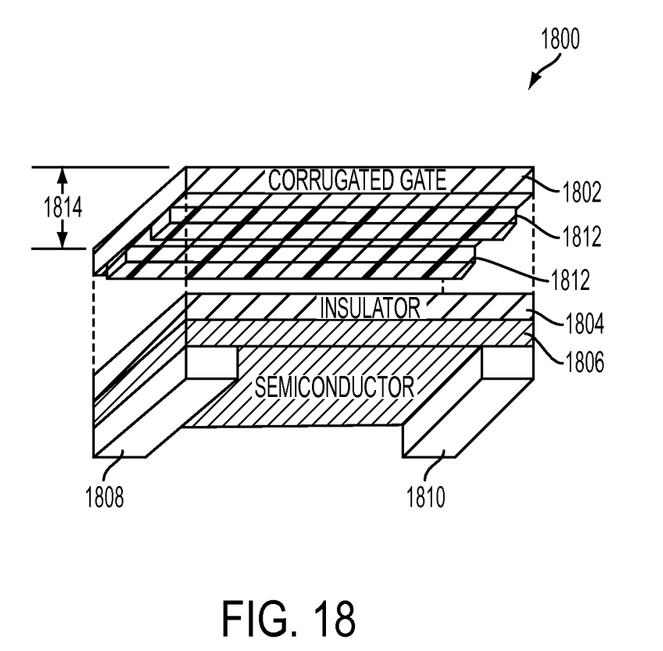
FIG. 18 illustrates a top-gate TFT configured in accordance with the described teaching.

Turning to FIG. 18, illustrated is an alternative thin film transistor (TFT) structure 1800 incorporating a textured gate electrode 1802 as taught in the present application. While the TFT structure 200 of FIG. 2 is a bottom gate TFT, TFT 1800 is a top gate TFT configuration. In this arrangement TFT structure 1800, also includes an insulator 1804, a semiconductor 1806, a source electrode 1808 and a drain electrode 1810. The semiconductor material is deposited over (or on) source electrode 208 and drain electrode 210, with doping at the contacts and some overlap between the source and drain electrodes and the textured gate electrode 1802 to provide low contact resistance. The texture of gate electrode 1802, in the embodiment of FIG. 18, is a corrugation design having a series of ridges (or stripes) 1812 positioned to lie along channel length 1814 which extends from source electrode 1808 to drain electrode 1810, similar to that described in connection with FIG. 2

It is to be understood the method of forming the textured TFT 1800 of FIG. 18 may be accomplished by the processing previously described.

Thus fabrication methods according to the present concepts create raised conductive surfaces. If these surfaces have high curvature, there are two physical situations that occur simultaneously. First, the gate dielectric becomes thinner (if the dielectric does not perfectly conform) in the raised regions, second, the high curvature reflects a high charge density in the semiconductor. Both of these situations effectively add together to create a percolation path from the source to drain.

The methods described herein for fabricating TFTs with a textured gate electrode is implemented by any of a number of known fabrication techniques such as, but not being limited to ink jet printing, gravure printing, photo-lithography, self-assembly by metal "wrinkling" or "buckling", self-assembly using a "coffee stain effect", microscopic bump like texturing obtained by providing metal droplets to a surface of a plane surface, such as a plan gate surface and allowing the metal droplets to solidify on the plane surface, among others. It is also to be understood the insulator layer of the TFT structure can be formed by use of a number of known insulator deposition techniques (e.g., Physical Vapor Deposition, Chemical Vapor Deposition, Sputtering, Beam Deposition, etc.). Such techniques being capable of controlling insulator thickness, including insulator thickness along the vertical (or sloped) faces of the textured gate. The insulator thickness, including the thickness along the vertical (or sloped) faces the gate affecting gate current. For example, a thinner insulator can enhance gate current, and is therefore a consideration particularly in low voltage operation situations, such as in some embodiments 10 v to 4 v, or lower.

Thus, as shown, modification of the gate texture and geometry modifies the on currents of the textured TFTs. While the concave edges are likely responsible for the lower turn on voltage, the convex edges are likely responsible for the higher mobilities. An aspect to consider when employing texture is the higher leakage currents. It is also possible that the textures cause more charge trapping It will be appreciated that variants of the above-disclosed and other features and functions, or alternatives thereof, may be combined into many other different systems, methods or applications. Various presently unforeseen or unanticipated alternatives, modifications, variations or improvements therein may be subsequently made by those skilled in the art which are also intended to be encompassed by the following claims.

What is claimed is:

1. A thin film transistor comprising:
an insulator;
a semiconductor;
a textured gate electrode, wherein the textured gate electrode includes a plurality of dried metal droplets spaced from each other on a plane gate surface in a form of microscopic bump texturing;
a source electrode; and
a drain electrode,
wherein the insulator is sandwiched between the semiconductor and the textured gate electrode.

2. The thin film transistor according to claim 1 wherein the source electrode and the drain electrode are deposited over the semiconductor.

3. The thin film transistor according to claim 1 wherein the semiconductor is deposited over the source electrode and the drain electrode.

4. The thin film transistor according to claim 1 wherein the textured gate electrode includes a surface modified in a manner which increases a current flow of the thin film transistor.

5. The thin film transistor according to claim 1 wherein the metal droplets on the plane gate surface are arranged in at least one of a "polka dot" pattern or a random arrangement.

6. The thin film transistor according to claim 1 wherein the metal droplets are arranged in a varying density over the plane gate surface.

7. The thin film transistor according claim 1 wherein at least a portion of the semiconductor takes on the texturing of the gate electrode.

8. The thin film transistor according to claim 1 wherein at least a portion of the insulator takes on the texturing of the gate electrode.

9. A method for fabricating a textured thin film transistor comprising:
forming a textured gate electrode, wherein the step of forming the textured gate electrode includes assembling the textures in a self-assembly process, and wherein the self-assembly process includes texturing by metal buckling to form corrugations;
forming an insulator layer;
forming semiconductor layer, wherein the semiconductor is deposited over the source electrode and the drain electrode; and
forming a source electrode and drain electrode.

10. The method according to claim 9 wherein the forming of the self-assembled textured gate electrode includes modifying a surface of the textured gate electrode in a manner which increases current flow in the thin film transistor.

11. The method according to claim 9 further including providing overlap between the source electrode and the drain electrode and the textured gate electrode to ensure low contact resistance.

12. The method according to claim 9 wherein the forming of the corrugations includes forming a series of ridges positioned to lie along a channel length of the thin film transistor which extends from source electrode to drain electrode.

13. The method according to claim 9 wherein the forming of the corrugations includes a linear texturing of the gate having flat and high curvature stripes.

14. A method for fabricating a textured thin film transistor comprising:
forming a textured gate electrode, wherein the step of forming the textured gate electrode includes texturing by providing a plurality of metal droplets spaced from each other to a plane gate surface and allowing the metal droplets to dry on the plane gate surface, wherein microscopic bump texturing is achieved;
forming an insulator layer;
forming semiconductor layer; and
forming a source electrode and drain electrode;
wherein the metal droplets on the plane gate surface are arranged in at least one of a "polka dot" pattern or a random arrangement, and wherein the metal droplets are arranged in a varying density over the plane gate surface.

15. The method according to claim 9 wherein the step of forming the insulator layer includes using one of a plurality of insulator deposition techniques to effect a thickness of the insulator layer along the sloped or vertical faces of the textured gate.

16. The method according to claim 9 wherein the insulator applied at thinner thicknesses than an insulator applied to a non-textured gate, enhances gate current for operation in a low voltage operation.

17. The method according to claim 9, wherein the self-assembly process is performed without a predefined pattern for the textures.

* * * * *